United States Patent [19]

Svejda et al.

[11] Patent Number: 5,420,818

[45] Date of Patent: May 30, 1995

[54] STATIC READ ONLY MEMORY (ROM)

[75] Inventors: Frank J. Svejda, Plano; Raghuram S. Tupuri, Austin, both of Tex.

[73] Assignee: Texas Instruments Incorporated, Dallas, Tex.

[21] Appl. No.: 176,671

[22] Filed: Jan. 3, 1994

[51] Int. Cl.⁶ .................. G11C 17/00; G11C 11/40
[52] U.S. Cl. .................... 365/104; 365/181; 365/182
[58] Field of Search .......... 365/104, 182, 189.11, 365/230.04, 181

[56] References Cited

U.S. PATENT DOCUMENTS

| | | | |
|---|---|---|---|
| 4,773,047 | 9/1988 | Uchino et al. | 365/104 X |
| 4,873,670 | 10/1989 | Tanaka et al. | 365/104 X |
| 4,899,308 | 2/1990 | Khan | 365/104 |
| 5,117,389 | 5/1992 | Yiu | 365/104 |
| 5,319,593 | 6/1994 | Wolstenholme | 365/184 X |

Primary Examiner—Joseph A. Popek
Assistant Examiner—Son Dinh
Attorney, Agent, or Firm—Ronald O. Neerings; James C. Kesterson; Richard L. Donaldson

[57] ABSTRACT

A static read-only-memory (ROM) is derived from a gate array in which both P-channel transistor (24) and an N-channel transistor (30) are used to convey a logic 1 or 0 to a bitline (Bitline0). The invention maximizes the use of gate array transistors in a gate-array chip and achieves a high density of ROM bits per unit area. In CMOS gate arrays, transistors are arrayed in alternating rows of P-channel and N-channel transistors. A decoding scheme inverts the logic signal to each row of P-channel transistors to yield a functional ROM.

19 Claims, 2 Drawing Sheets

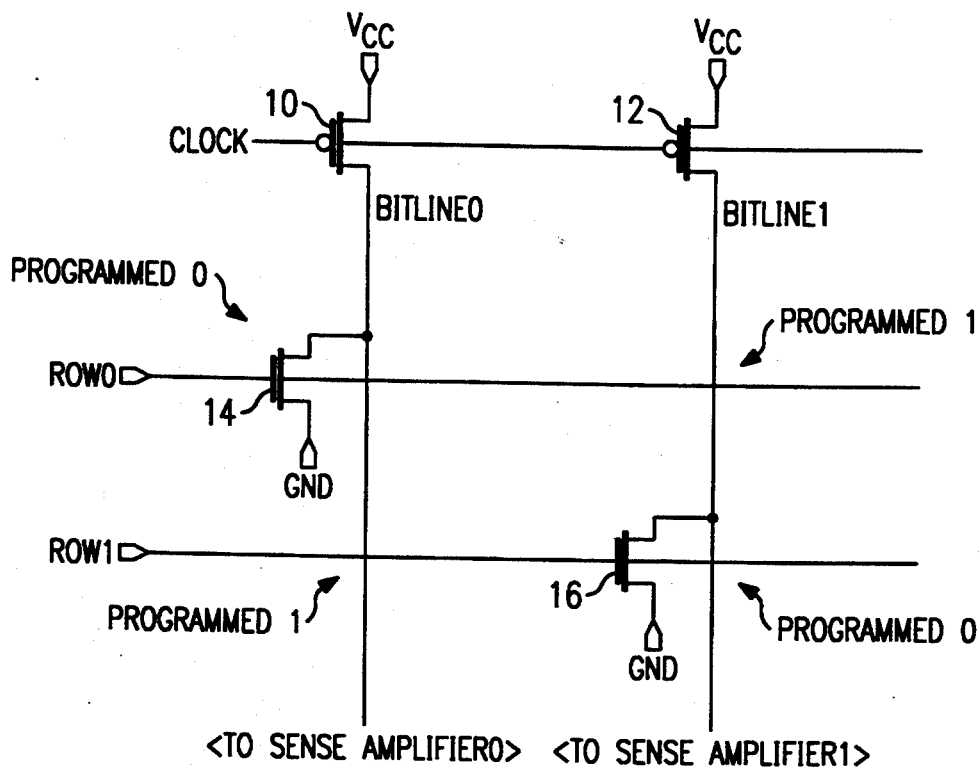
FIG. 1
*(PRIOR ART)*
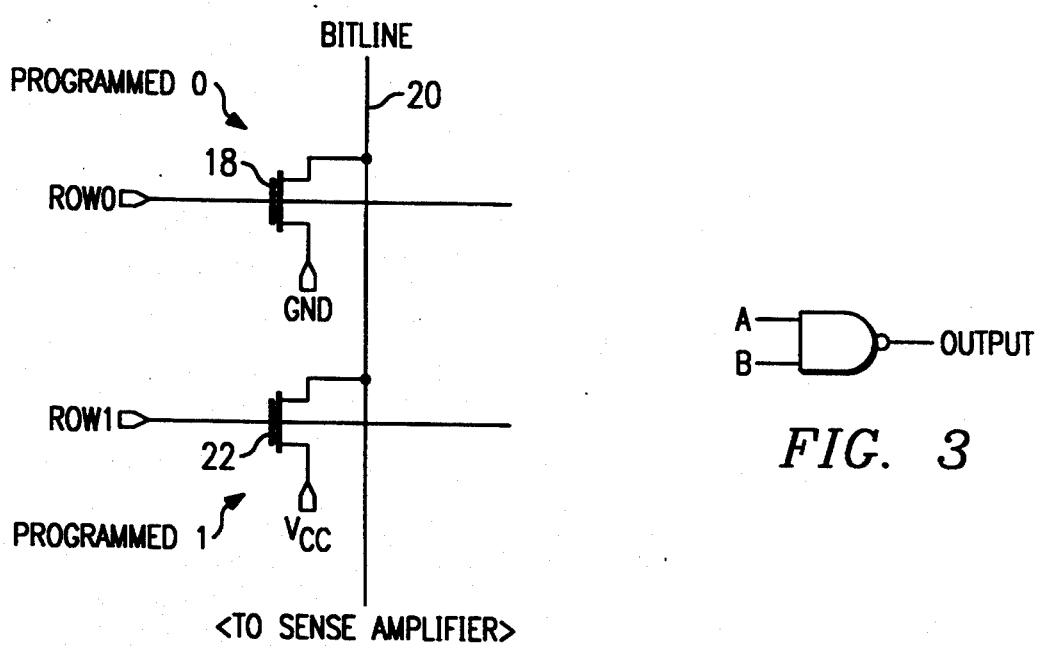
FIG. 2
*(PRIOR ART)*
FIG. 3

STATIC READ ONLY MEMORY (ROM)

FIELD OF THE INVENTION

The present invention relates to the field of integrated circuit devices. More specifically, the present invention relates to a novel static read-only memory (ROM).

BACKGROUND OF THE INVENTION

There are presently two methods of read only memory (ROM) implementation that use single N-channel (NCH) transistors to program a logic low or 0 on a bitline. In the first method, shown in FIG. 1, a P-channel transistor and an N-channel transistor are used to convey logic signals to a respective bitline.

Bitlines Bitline0 and Bitline1 are precharged logic high by P-channel (PCH) transistors 10 and 12, respectively. The gates of P-channel transistors 10 and 12 are connected to a clock which transmits clock signals that control the precharge mode. The drain, source and gate of N-channel transistor 14 are connected to Bitline0, ground and Row0, respectively. The drain, source and gate of N-channel transistor 16 are connected to Bitline 1, ground and Row1, respectively. A logic high or 1 at the gate of N-channel transistor 14 turns on transistor 14 effectively connecting Bitline0 to ground. The result is a logic low or 0 on Bitline0. Contrariwise, a logic low or 0 at the gate of N-channel transistor 14 turns off transistor 14 disconnecting Bitline0 from ground. The result is a logic high or 1 on Bitline0. Similarly, a logic high or 1 at the gate of N-channel transistor 16 turns on transistor 16 effectively connecting Bitline 1 to ground. The result is a logic low or 0 on Bitline 1. Contrariwise, a logic low or 0 at the gate of N-channel transistor 16 turns off transistor 16 disconnecting Bitline1 from ground. The result is a logic high or 1 on Bitline1.

In the second method, shown in FIG. 2, two N-channel transistors are used to convey logic signals to a respective bitline. The drain, source and gate of N-channel transistor 18 are connected to bitline 20, ground and Row0, respectively. The drain, source and gate of N-channel transistor 22 are connected to bitline 20, ground and Row1, respectively. A logic high or 1 at the gate of N-channel transistor 18 turns on transistor 18 effectively connecting Bitline 20 to ground. The result is a logic low or 0 on Bitline 20. A logic low or 0 at the gate of N-channel transistor 18 turns off transistor 18 disconnecting Bitline 20 from ground. Similarly, a logic high or 1 at the gate of N-channel transistor 22 turns on transistor 22 effectively connecting Bitline 20 to Vcc. The result is a logic high or 1 on Bitline 20.

SUMMARY OF THE INVENTION

The present invention disclosed herein comprises a static read-only-memory (ROM) utilizing both P-channel (PCH) and N-channel (NCH) transistors in a gate array to convey logic signals to a bitline. The invention maximizes the use of gate array transistors in a gate-array chip and achieves a high density of ROM bits per unit area. In CMOS gate arrays, transistors are arrayed in alternating rows of P-channel and N-channel transistors. A decoding scheme inverts the logic signal to each row of P-channel transistors to yield a functional ROM.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a schematic diagram of a prior art ROM implementation that utilizes a PCH transistor to precharge a bitline logic high and a single NCH transistor to program bitline a logic low.

FIG. 2 is a schematic diagram of a prior art ROM implementation that utilizes one NCH transistor to program the bitline a logic low and another NCH transistor to program the bitline a logic high.

FIG. 3 shows a two-input NAND gate.

DETAILED DESCRIPTION OF PREFERRED EMBODIMENTS

Figure 4:
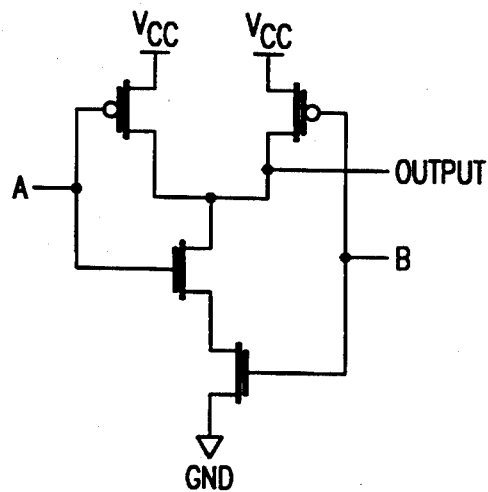
FIG. 4 is a schematic diagram of NCH and PCH transistors interconnected to perform the logic function of the NAND gate of FIG. 3.

Gate arrays in a semiconductor are used to perform logic functions. Common logic functions, such as AND, OR, NAND, NOR, etc., are accomplished via logic gates. Logic gates typically utilize at least two interconnected transistors. FIG. 3 is the schematic of a two input NAND gate. FIG. 4 is a schematic of one scheme of transistor interconnection that performs the NAND function of the logic gate of FIG. 3. Complex logic functions may require the interconnection of many gates.

In a CMOS gate array there is always one NCH transistor for each PCH transistor. The ROM implementation scheme of FIG. 2 uses NCH transistors exclusively. But use of NCH transistors exclusively results in the waste of the complementary PCH devices. The ROM implementation scheme of FIG. 1 uses PCH transistors for precharging the bitlines and NCH transistors for programming the bitlines. But the PCH transistors are not part of the memory array, and even if they were, only 1 PCH transistor is used per bitline—as compared with the multiple NCH transistors used per bitline. In devices using the implementation schemes of FIGS. 1 and 2, there is non-usage of PCH and NCH transistor in the die area. Non-usage of either PCH or NCH transistors results in wasted die area.

Figure 5:
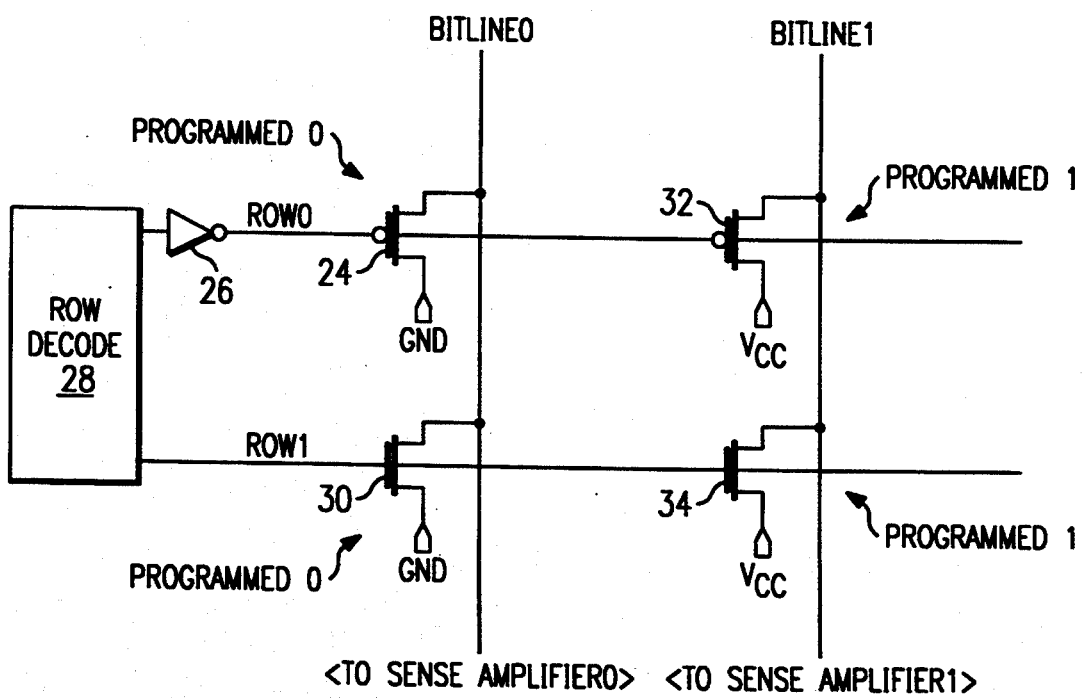
FIG. 5 is a schematic diagram of a ROM implementation according to one embodiment of the invention.

FIG. 5 discloses a novel static read-only-memory (ROM) derived from a CMOS gate array, according to one embodiment of the invention. PCH transistors and NCH transistors, from alternating rows of P-channel and N-channel transistors in a gate array, are used to convey a logic the bitlines. An NCH transistor and a PCH transistor are used to program a 1 or 0 on a bitline. One NCH transistor is used to pull up the bitline and one PCH transistor is used to pull down the bitline or, one NCH transistor is used to pull down the bitline and one PCH transistor is used to pull up the bitline. The selection of a particular transistor to perform a particular function depends upon its location on the gate array. The goal is to maximize the number of memory bits per unit area.

In FIG. 5, the drain, source and gate of P-channel transistor 24 are connected to bitline0, ground and rowline Row0, respectively. An inverter 26 couples Row Decode 28 to the gate of transistor 24. The drain, source and gate of N-channel transistor 30 are connected to bitline0, ground and rowline Row1, respectively. Row1 couples Row Decode 28 to the gate of transistor 30. A logic low or 0 at the gate of P-channel transistor 24 turns on transistor 24 effectively connecting Bitline0 to ground. The result is a logic low or 0 on Bitline0. A logic high or 1 at the gate of P-channel transistor 24 turns off transistor 24 disconnecting Bitline0 from ground. Similarly, a logic high or 1 at the gate of N-channel transistor 30 turns on transistor 30 effectively connecting Bitline0 to Vcc. The result is a logic high or 1 on Bitline0.

The drain, source and gate of P-channel transistor 32 are connected to bitline 1, ground and rowline Row1, respectively. An inverter 26 couples Row Decode 28 to the gate of transistor 32. The drain, source and gate of N-channel transistor 34 are connected to bitline 1, ground and rowline Row1, respectively. Row1 couples Row Decode 28 to the gate of transistor 34. A logic low or 0 at the gate of P-channel transistor 32 turns on transistor 24 effectively connecting Bitline1 to Vcc. The result is a logic high or 1 on Bitline1. A logic high or 1 at the gate of P-channel transistor 32 turns off transistor 32 disconnecting Bitline 1 from Vcc. Similarly, a logic high or 1 at the gate of N-channel transistor 34 turns on transistor 30 effectively connecting Bitline 1 to ground. The result is a logic low or 0 on Bitline1.

A PCH Vt is lost whenever a PCH transistor is used to pull a bitline to ground. Contrariwise, an NCH Vt is lost whenever an NCH transistor is used to pull up a bitline to Vcc. Logic level recovery circuitry (not shown) can be added to compensate for these losses if they present a problem.

The use of both NCH and PCH transistors in the gate array to implement a ROM is an advantage of the present invention. The source of NCH and PCH transistors can be connected to either ground or VCC, depending upon the location of the transistor within the array and the ROM requirements. The scope of the present invention also includes row decoding to utilize PCHs in the programming. Normal n-to-$2^n$ decoding is used. As shown in FIG. 5, an inverter is coupled to the output of the decoded signals which must drive the PCH device along a row. Thus, each row must have only one type of transistor—NCH or PCH—for this scheme to function.

While this invention has been described with reference to an illustrative embodiment, this description is not to be construed in a limiting sense. Various modifications to the illustrative embodiment, as well as other embodiments of the invention will be apparent to persons skilled in the art upon reference to this description. It is therefore contemplated that the appended claims will cover any such modifications or embodiments as fall within the true scope of the invention.

What is claimed:

1. A read-only memory (ROM) device, comprising:
    alternating rows of P-channel and N-channel transistors;
    a first electrode of a first P-channel transistor in one of said rows of P-channel transistors, connected to a first bitline and a second electrode of said first P-channel transistor connected to a first voltage reference;
    a first electrode of a first N-channel transistor in a row of N-channel transistors adjacent said one of said rows of P-channel transistors, connected to said first bitline and a second electrode of said first N-channel transistor connected to said first voltage reference;
    a first electrode of a second P-channel transistor adjacent said first P-channel transistor in said one of said rows of P-channel transistors, connected to a second bitline and a second electrode of said second P-channel transistor connected to a second voltage reference;
    a first electrode of a second N-channel transistor adjacent said first N-channel transistor in said row of N-channel transistors adjacent said one of said rows of P-channel transistors connected to said second bitline and a second electrode of said second N-channel transistor connected to said second voltage reference;
    a first row line coupling gates of said first and second P-channel transistors to the output of an inverter, the input of said inverter connected to a row decoder; and
    a second row line coupling gates of said first and second N-channel transistors to said row decoder.

2. The read-only memory (ROM) device of claim 1 in which said P-channel and N-channel transistors are field effect transistors (FETs).

3. The read-only memory (ROM) device of claim 1 in which said P-channel and N-channel transistors are CMOS devices.

4. The read-only memory (ROM) device of claim 1 in which said P-channel and N-channel transistors are part of a gate array.

5. The read-only memory (ROM) device of claim 1 in which said first reference voltage is ground and said second reference voltage is Vcc.

6. The, read-only memory (ROM) device of claim 1 in which said first reference voltage is Vcc and said second reference voltage is ground.

7. The read-only memory (ROM) device of claim 1 in which said first electrodes of said P-channel and N-channel transistors are drains and said second electrodes of said P-channel and N-channel transistors are sources.

8. A device, comprising:
    a gate array having respective rows of N-channel and P-channel transistors;
    a first electrode of a first P-channel transistor in one of said rows of P-channel transistors, connected to a first bitline and a second electrode of said first P-channel transistor connected to a first voltage reference;
    a first electrode of a first N-channel transistor in one of said rows of N-channel transistors adjacent said one of said rows of P-channel transistors, connected to said first bitline and a second electrode of said first N-channel transistor connected to said first voltage reference;
    a first electrode of a second P-channel transistor adjacent said first P-channel transistor, connected to a second bitline and a second electrode of said second P-channel transistor connected to a second voltage reference;
    a first electrode of a second N-channel transistor adjacent said first N-channel transistor, connected to said second bitline and a second electrode of said second N-channel transistor connected to said second voltage reference;
    a first row line coupling gates of said first and second P-channel transistors to the output of an inverter, the input of said inverter connected to a row decoder; and
    a second row line coupling gates of said first and second N-channel transistors to said row decoder.

9. The device of claim 8 in which said transistors are in respective alternating rows of P-channel and N-channel transistors.

10. The device of claim 8 in which said first reference voltage is ground and said second reference voltage is Vcc.

11. The device of claim 8 in which said first reference voltage is Vcc and said second reference voltage is ground.

12. The device of claim 1 in which said first electrodes of said P-channel and N-channel transistors are drains and said second electrodes of said P-channel and N-channel transistors are sources.

13. A method of making a read-only memory (ROM) device, comprising:
    connecting a first electrode of a first P-channel transistor in a row of P-channel transistor, to a first bitline and connecting a second electrode of said first P-channel transistor to a first voltage reference;
    connecting a first electrode of a first N-channel transistor in a row of N-channel transistors adjacent said row of P-channel transistors, to said first bitline and connecting a second electrode of said first N-channel transistor to said first voltage reference;
    connecting a first electrode of a second P-channel transistor adjacent said first P-channel transistor, to a second bitline and connecting a second electrode of said second P-channel transistor to a second voltage reference;
    connecting a first electrode of a second N-channel transistor adjacent said first N-channel transistor, to said second bitline and connecting a second electrode of said second N-channel transistor to said second voltage reference;
    connecting a first row line to gates of said first and second P-channel transistors and to the output of an inverter;
    connecting the input of said inverter to a row decoder; and
    connecting a second row line to gates of said first and second N-channel transistors and to said row decoder.

14. The method of making the read-only memory (ROM) device of claim 13 in which said P-channel and N-channel transistors are CMOS devices.

15. The method of making the read-only memory (ROM) device of claim 13 in which said transistors are in respective alternating rows of P-channel and N-channel transistors.

16. The method of making the read-only memory (ROM) device of claim 13 in which said P-channel and N-channel transistors are part of a gate array.

17. The method of making the read-only memory (ROM) device of claim 13 in which said first reference voltage is ground and said second reference voltage is Vcc.

18. The method of making the read-only memory (ROM) device of claim 13 in which said first reference voltage is Vcc and said second reference voltage is ground.

19. The method of making the read-only memory (ROM) device of claim 13 in which said first electrodes of said P-channel and N-channel transistors are drains and said second electrodes of said P-channel and N-channel transistors are sources.

* * * * *